(12) United States Patent
Hirsch et al.

(10) Patent No.: US 8,730,676 B2
(45) Date of Patent: May 20, 2014

(54) COMPOSITE COMPONENT AND METHOD FOR PRODUCING A COMPOSITE COMPONENT

(75) Inventors: Michele Hirsch, Esslingen (DE); Michael Guenther, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 266 days.

(21) Appl. No.: 13/146,599

(22) PCT Filed: Jan. 25, 2010

(86) PCT No.: PCT/EP2010/050771
§ 371 (c)(1),
(2), (4) Date: Sep. 21, 2011

(87) PCT Pub. No.: WO2010/086282
PCT Pub. Date: Aug. 5, 2010

(65) Prior Publication Data
US 2012/0002372 A1    Jan. 5, 2012

(30) Foreign Application Priority Data

Jan. 30, 2009 (DE) .......................... 10 2009 000 514

(51) Int. Cl.
*H05K 7/20* (2006.01)
*B32B 3/30* (2006.01)
*B32B 37/00* (2006.01)
*H05K 7/00* (2006.01)
*H05K 7/06* (2006.01)
*B32B 7/04* (2006.01)
*B32B 3/20* (2006.01)

(52) U.S. Cl.
USPC ................. 361/716; 361/679.53; 361/679.54; 361/704; 361/720; 361/760; 438/53; 438/64; 438/108; 438/406; 438/455; 257/415; 257/467; 257/678; 257/707; 257/777; 257/778; 428/105; 428/166; 428/172; 428/212; 428/447; 428/457; 174/252; 174/255; 174/256; 174/258; 174/260

(58) Field of Classification Search
USPC ....................... 361/679.46–679.54, 690–697, 361/702–712, 715–724, 736, 743, 748, 750, 361/760–767, 792–795; 174/15.1, 16.3, 174/250–267; 29/890.03, 890.032, 29/825–852; 165/80.3, 104.33, 185; 257/706–727, 40, 190, 691, 183, 18, 257/184, 20; 438/465, 406, 106–122, 457, 438/458; 428/166, 457, 172, 411.1, 701, 428/446, 698, 113, 343, 137, 209, 212
See application file for complete search history.

(56) References Cited

U.S. PATENT DOCUMENTS 3,451,030 A * 6/1969 Garfinkel .................... 338/2
3,467,569 A * 9/1969 Weber et al. ............... 428/317.7
(Continued)

FOREIGN PATENT DOCUMENTS

DE   10 2004 044   7/2005
DE   11 2005 001   6/2007
(Continued)

OTHER PUBLICATIONS

International Search Report for PCT/EP2010/050771, dated Apr. 16, 2010.

*Primary Examiner* — Michail V Datskovskiy
(74) *Attorney, Agent, or Firm* — Kenyon & Kenyon LLP

(57) ABSTRACT

A composite component includes a first joining partner, at least one second joining partner and a first joining layer situated between the first joining partner and the second joining partner. In addition to the first joining layer, at least one second joining layer is provided between the first and the second joining partner; and at least one intermediate layer is situated between the first and the second joining layer.

14 Claims, 2 Drawing Sheets

(56) References Cited

U.S. PATENT DOCUMENTS

| | | | |
|---|---|---|---|
| 4,146,438 A * | 3/1979 | de Nora et al. | 205/43 |
| 4,525,412 A * | 6/1985 | Nakane et al. | 428/199 |
| 4,574,879 A * | 3/1986 | DeGree et al. | 165/185 |
| 4,739,443 A * | 4/1988 | Singhdeo | 361/689 |
| 4,746,055 A * | 5/1988 | Ingram et al. | 228/123.1 |
| 4,888,247 A * | 12/1989 | Zweben et al. | 428/105 |
| 4,963,425 A * | 10/1990 | Buchanan et al. | 428/212 |
| 5,043,796 A | 8/1991 | Lester | |
| 5,142,441 A * | 8/1992 | Seibold et al. | 361/689 |
| 5,224,017 A * | 6/1993 | Martin | 361/707 |
| 5,234,152 A * | 8/1993 | Glaeser | 228/121 |
| 5,242,099 A * | 9/1993 | Ueda | 228/123.1 |
| 5,409,547 A * | 4/1995 | Watanabe et al. | 136/204 |
| 5,504,372 A * | 4/1996 | Braden et al. | 257/723 |
| 5,554,430 A * | 9/1996 | Pollatta et al. | 428/113 |
| 5,571,608 A * | 11/1996 | Swamy | 428/137 |
| 5,596,219 A * | 1/1997 | Hierold | 257/467 |
| 5,609,287 A * | 3/1997 | Izuta et al. | 228/123.1 |
| 5,652,055 A * | 7/1997 | King et al. | 428/343 |
| 5,754,403 A * | 5/1998 | Ozmat et al. | 361/720 |
| 6,001,471 A * | 12/1999 | Bries et al. | 428/343 |
| 6,159,762 A * | 12/2000 | Scheiter et al. | 438/53 |
| 6,219,237 B1 * | 4/2001 | Geusic et al. | 361/699 |
| 6,284,985 B1 | 9/2001 | Naba et al. | |
| 6,317,331 B1 * | 11/2001 | Kamath et al. | 361/760 |
| 6,320,136 B1 * | 11/2001 | Sakamoto | 174/255 |
| 6,327,149 B1 * | 12/2001 | Goenka | 361/720 |
| 6,396,712 B1 * | 5/2002 | Kuijk | 361/767 |
| 6,432,497 B2 * | 8/2002 | Bunyan | 428/40.1 |
| 6,548,177 B2 * | 4/2003 | Hieda et al. | 428/441 |
| 6,586,352 B1 * | 7/2003 | Blumberg et al. | 442/181 |
| 6,730,391 B1 * | 5/2004 | Saijo et al. | 428/209 |
| 6,756,285 B1 * | 6/2004 | Moriceau et al. | 438/455 |
| 6,759,660 B2 * | 7/2004 | Izumi et al. | 250/370.01 |
| 6,987,671 B2 * | 1/2006 | Houle | 361/704 |
| 7,038,213 B2 * | 5/2006 | Izumi et al. | 250/370.01 |
| 7,119,432 B2 * | 10/2006 | Desai et al. | 257/706 |
| 7,131,486 B2 * | 11/2006 | Goodson et al. | 165/80.4 |
| 7,219,826 B2 | 5/2007 | Nakamura | |
| 7,323,764 B2 * | 1/2008 | Wallis | 257/613 |
| 7,338,640 B2 * | 3/2008 | Murthy et al. | 422/83 |
| 7,451,656 B2 * | 11/2008 | Yokoyama et al. | 73/754 |
| 7,527,873 B2 * | 5/2009 | Kumar et al. | 428/447 |
| 7,534,701 B2 * | 5/2009 | Ghyselen et al. | 438/458 |
| 7,572,665 B2 * | 8/2009 | Datta et al. | 438/64 |
| 7,764,494 B2 * | 7/2010 | Balzano | 361/689 |
| 7,887,936 B2 * | 2/2011 | Le Vaillant | 428/701 |
| 8,012,324 B2 * | 9/2011 | Oya et al. | 204/426 |
| 8,114,754 B2 * | 2/2012 | Letertre | 438/406 |
| 8,299,604 B2 * | 10/2012 | Datta et al. | 257/700 |
| 2001/0020700 A1 * | 9/2001 | Inoue et al. | 257/20 |
| 2002/0025441 A1 * | 2/2002 | Hieda et al. | 428/440 |
| 2002/0125563 A1 | 9/2002 | Scheuermann | |
| 2002/0185726 A1 | 12/2002 | North et al. | |
| 2003/0071275 A1 * | 4/2003 | Torvik | 257/184 |
| 2004/0040651 A1 * | 3/2004 | Tsugaru et al. | 156/272.2 |
| 2004/0194861 A1 * | 10/2004 | Endou et al. | 148/432 |
| 2005/0082554 A1 * | 4/2005 | Torvik | 257/85 |
| 2005/0189342 A1 | 9/2005 | Kabbani | |
| 2006/0023436 A1 | 2/2006 | Sugahara | |
| 2006/0145186 A1 * | 7/2006 | Wallis | 257/190 |
| 2007/0231648 A1 * | 10/2007 | Han et al. | 429/30 |
| 2008/0189948 A1 * | 8/2008 | Schulz-Harder | 29/890.032 |
| 2008/0217717 A1 * | 9/2008 | Pfister et al. | 257/443 |
| 2008/0248231 A1 * | 10/2008 | Daigaku et al. | 428/41.8 |
| 2009/0086435 A1 * | 4/2009 | Suzuki et al. | 361/704 |

FOREIGN PATENT DOCUMENTS

| | | |
|---|---|---|
| EP | 1 225 633 | 7/2002 |
| EP | 1 811 257 | 7/2007 |
| EP | 1 926 142 | 5/2008 |
| EP | 1 930 943 | 6/2008 |
| EP | 1 995 773 | 11/2008 |
| EP | 1 995 774 | 11/2008 |
| JP | 1-289297 | 11/1989 |
| JP | 2001-24120 | 1/2001 |
| JP | 2001 291 925 | 10/2001 |
| JP | 2006-294699 | 10/2006 |
| JP | 2007-19203 | 1/2007 |
| JP | 2008-151154 | 7/2008 |
| JP | 2008-294280 | 12/2008 |
| WO | WO 98/03997 | 1/1998 |

* cited by examiner

COMPOSITE COMPONENT AND METHOD FOR PRODUCING A COMPOSITE COMPONENT

FIELD OF THE INVENTION

The present invention relates to a composite component, including a first and at least one second joining partner. The first joining partner is preferably an electronic element, particularly a power semiconductor or a circuit substrate, that is particularly fitted with components, preferably fitted with a power semiconductor, and the second joining partner is a heat sink. In addition, the present invention relates to a method for producing a composite component.

BACKGROUND INFORMATION

At the present time, for automotive applications, electric circuits having high power losses, such as power circuits or B bridges, H bridges on DEC or AMB substrates are connected to a heat sink using a heat-conductive adhesive. The amount of heat of the semiconductor of the electric circuit that is dissipated is conveyed by the circuit substrate and the heat-conductive adhesive, that forms the joining location, to a base plate or a housing, in order to eliminate heat from the at least one electronic component, and thus to cool it in a suitable manner. The base plate or the housing, in turn, may be cooled passively or actively, especially by a flowing medium. In the case of the composite component described above, it is a disadvantage that the joining layer formed by the heat-conductive adhesive represents a noticeable bottleneck for the heat dissipation, even at relatively short temporal pulse loading. One alternative to this is connecting the circuit substrate that is fitted with components to the heat sink using a soldering material, which has a higher heat-conductive capacity than heat-conductive adhesives. But this has the disadvantage that, because of the thermomechanical stress of the composite component in operation, a breakup of the solder may occur. This has as a result that making a connection using a solder material does frequently not make sense, based on the service life requirements, or that only small areas may be connected via a soldering material.

SUMMARY

Example embodiments of the present invention provide a composite component that stands out by being resistant to temperature change and/or heat dissipation, and example embodiments of the present invention provide a method for producing a composite component that is resistant to temperature change.

In order to avoid repetitions, features disclosed in terms of the device shall also count as disclosed in terms of the method. Likewise, features disclosed in terms of the method shall count as disclosed in terms of the device.

Example embodiments of the present invention are based on not joining two joining partners to each other using a single joining layer, as is conventionally done, but using at least two, preferably exclusively two joining layers between which at least one, preferably exclusively one additional layer, namely an intermediate layer, is situated. In this context, the joining layers have the objective of connecting the respective joining partner to the intermediate layer in a fixed manner, and to take care of the necessary electrical and/or mechanical and/or thermal connection of the joining partners to the intermediate layer. The intermediate layer is preferably selected such that its thermal coefficient of expansion is low, in order thereby to optimize the resistance to temperature change of the composite component. In a manner that is quite especially preferred, the expansion behavior of the intermediate layer corresponds at least approximately to the expansion behavior of at least one of the joining partners, preferably of a semiconductor, particularly on its circuit side, a difference in the coefficients of expansion also being acceptable, but this should be as small as possible. Because of the provision of the intermediate layer having a low thermal coefficient of expansion, which is preferably similar to the thermal coefficient of expansion of one of the joining partners, the resistance to temperature change of the composite component is increased. Furthermore, an additional spreading of heat pulses develops. Quite especially preferred, as will be explained below, in the case of at least one of the joining layers, quite especially preferred in the case of both joining layers, it is a sinter layer, particularly having metallic sinter particles, to assure an electrical, thermal and mechanical joining of the joining partners to the preferably electrically and/or thermally conductive intermediate layer. As the intermediate layer one may use silicon, for example.

Example embodiments of the present invention may be used, for example, in power outputs of electrical power steering, in power outputs of universal rectifier units, particularly in hybrid vehicle applications or electric vehicle applications, in power circuits in DC/DC converters, especially for hybrid applications, in controller electronic systems, particularly on a starter/generator, in press-fit diodes on generator end shields, in high temperature resistant semiconductors, such as silicon carbide or even in sensors that are operated at high temperature and which require an evaluation electronic system close to the sensor, as well as in modules for inverters in photovoltaic systems. Additional applications are possible too.

As was indicated at the outset, it is advantageously provided that the thermal coefficient of expansion of the intermediate layer, at least approximately, corresponds to the thermal coefficient of expansion of the first and/or the second joining partner. Quite especially preferred, the thermal coefficient of expansion of the intermediate layer corresponds to an electrical or an electronic component, that is used as a joining partner, preferably a semiconductor, quite especially preferred a power semiconductor, additionally preferred, on its circuit side. Still further preferred, the intermediate layer material corresponds to the, or a material of the electric and/or electronic component.

It is particularly expedient if the two joining partners are connected to each other via exclusively three layers, namely, the first joining layer directly contacting the first joining partner, the second joining layer directly contacting the second joining partner and the intermediate layer situated between the joining layers.

In particular, when at least one of the joining layers, preferably both joining layers, are arranged as sinter layers, it is preferred if the intermediate layer is patterned laterally, in order thus to connect in each case only limited areas to the at least one metallic sinter layer. By doing this, temperature change-conditioned mechanical stresses may be reduced to a minimum. In addition or alternatively to a lateral patterning of the intermediate layer, it is possible to pattern the first and/or the second joining layer laterally. Quite particularly preferred, the intermediate layer and/or the first and/or the second joining layer are/is applied already patterned, quite particularly preferred in surface sections distanced laterally from one another.

In addition, it is preferred if the first and/or the second joining layer and/or the intermediate layer are patterned such that between pattern sections of the respective layer at least one fluid channel, preferably a fluid channel network is formed, which is suitable for and determined so that through it a cooling fluid, particularly a cooling gas or a cooling liquid, is able to be guided in order thus to be able to carry off additional heat from the composite component. Quite especially preferred in this context is if the fluid channel or the fluid channel network is formed within the intermediate layer between the pattern sections of the intermediate layer. In other words, at least one of the connecting layers is patterned such that cavities are created through which a cooling fluid is able to be guided in order to withdraw heat from the entire construction. In the simplest case this may be a gas. Having a cooling fluid flowing through has the advantage that a greater heat quantity is able to be absorbed.

A device for applying fluid to the fluid channel and/or the fluid channel network are provided. In the simplest case, this may be a fan device, using which, air is able to be blown and/or sucked through the fluid channel or the fluid channel network. If a cooling liquid is provided, it is preferred if the device for acting on the fluid channel and/or the fluid channel network include at least one pump.

There are various possibilities for configuring the joining layers. As was indicated at the outset, it is especially preferred if at least one of the joining layers, preferably both joining layers, are/is arranged as a sinter layer, particularly having metallic sinter particles, so as to achieve thereby an optimal thermal and electrical connection of the joining partners to the intermediate layer. In addition or alternatively, at least one of the joining layers may be arranged as an adhesive layer or solder metal layer, especially using lead-free solder. It is also possible to arrange the intermediate layer as a gradient material layer produced by alloying or as a layer produced by welding. It is especially preferred if at least one of the layers, that is, the first and/or the second joining layer and/or the intermediate layer, is micro-patterned and/or nano-patterned, that, for example, pyramidal patterns, channels or similar patterns, such as are used, for instance, in solar cells as light traps, are implemented, in order to enlarge the area for heat transition into the cooling fluid. It is also possible to pattern a joining partner, preferably a heat sink, macroscopically for improved temperature dissipation.

Particularly expedient is an example embodiment in which at least one sensor is inserted into the first and/or the second joining layer and/or (which is preferred) into the intermediate layer, especially a temperature sensor. The latter then does not measure the temperature directly at the hottest place of a joining partner, particularly of a semiconductor, but somewhere below it. This has the advantage that a space saving is able to be implemented on the circuit substrate and/or that one may do without additional expensive semiconductor surface. It is quite especially preferred if the at least one sensor, preferably the temperature sensor, is able to be electrically conductively connected to a joining partner using through contacting.

Quite especially preferred is an example embodiment of the composite component in which the first joining partner is or includes an electronic component, especially a semiconductor component, preferably a power semiconductor component. Quite especially preferably, a circuit substrate equipped with at least one electronic component, is involved which, further preferred, is connected directly to the intermediate layer via the first joining layer. It is additionally preferred if the second joining partner is an heat sink, particularly a base plate, a cooling body or an housing, it being even further preferred if this second joining partner is connected directly via the second joining layer to the intermediate layer, which quite especially preferred is made of silicon.

Example embodiments of the present invention provide a method for producing a composite component, preferably a composite component arranged as described above. The method stands out in that the at least two, preferably exclusively two joining partners are joined via at least three, preferably exclusively three layers, namely a first and a second joining layer as well as an intermediate layer, situated between them, are joined to one another. There are different possibilities with regard to configuring joining layers, as was described above with the aid of the composite component. Thus, at least one of the joining layers may be arranged as a sinter layer, adhesive layer or solder metal layer. There are also different possibilities with respect to applying the layers onto at least one of the joining partners. Thus, an example embodiment is possible in which the at least three, preferably exclusively three layers are applied, one after the other, onto one of the joining partners, whereupon the additional joining partner is applied to the three layers. It is also possible that each joining partner be supplied with one joining layer, whereupon the intermediate layer is applied onto one of the joining layers.

With regard to example embodiments and refinements of the method, we point to the previous description of the composite component, from which example embodiments of the method may be derived.

Additional advantages, features and details of example embodiments of the present invention are described in the following description as well as from the figures.

DETAILED DESCRIPTION

Figure 1:
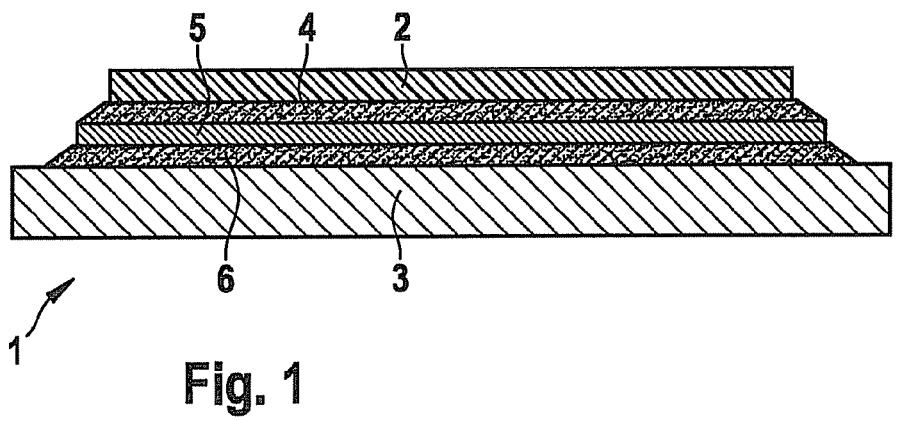
FIG. 1: a first exemplary embodiment of a composite component having unpatterned joining layers as well as an unpatterned intermediate layer.

Identical elements and elements that have the same function have been provided with matching reference numerals in the figures.

A first exemplary embodiment of a composite component 1 is shown in FIG. 1. One may see a first and a second joining partner 2, 3, which are connected to each other mechanically, thermally and electrically via a layer system. First joining partner 2, for example, is a circuit substrate equipped with at least one power semiconductor, and second joining partner 3 is a heat sink, particularly a base plate, a cooling body, a combination of a base plate and a cooling body and/or a housing.

One may recognize the abovementioned layer system between the two joining partners 2, 3. It is made up of a first joining layer 4, an intermediate layer 5, directly contacting first joining layer 4, which in turn directly contacts a second joining layer 6 which, in turn, connects second joining partner 3 directly to intermediate layer 5. The two joining layers 4, 6 are preferably arranged identically, but may also be arranged differently, depending on the purpose of its application. Both the first and the second joining layer 4, 6 preferably are sinter layers having metallic sinter particles. Intermediate layer 5, which is formed of silicon in the exemplary embodiment shown, stands out in that its thermal coefficient of expansion corresponds to the thermal coefficient of expansion of the semiconductor that is connected to the circuit substrate on the circuit side.

Figure 2:
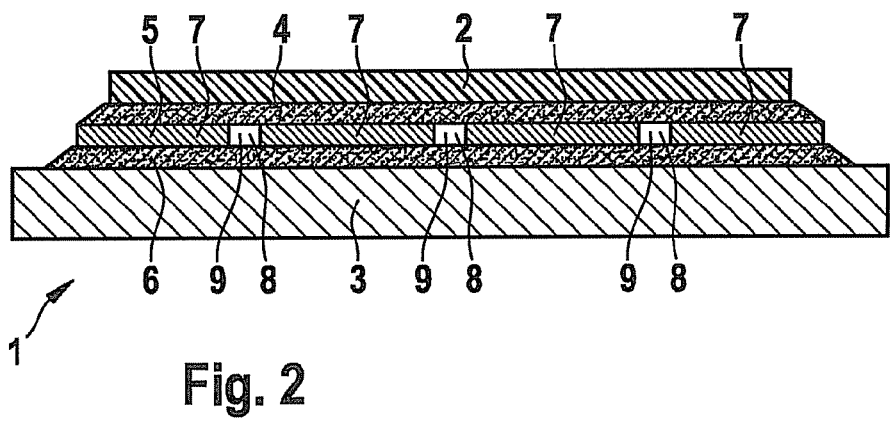
FIG. 2: an alternative exemplary embodiment of a composite component, in which the intermediate layer is patterned laterally.

Composite component 1 according to FIG. 2 differs from composite component 1 described above and shown in FIG. 1, in that intermediate layer 5 is patterned laterally, such that cavities 8 are formed between the laterally distanced patterning section 7, which are networked with one another and thus form a fluid channel network 9, through which the cooling fluid, particularly cooling gas or cooling liquid are able to be conducted. The smaller patterned sections 7 are selected, the smaller is the absolute connecting surface and the better is the resistance to temperature change.

Figure 3:
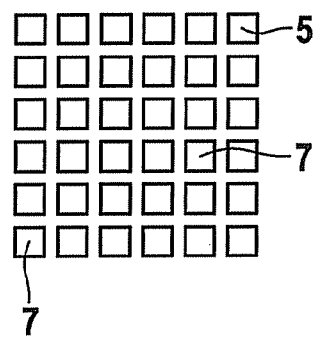
FIGS. 3-5: differently patterned patterning forms for patterning the first and/or the second joining layer and/or the intermediate layer
Figure 4:
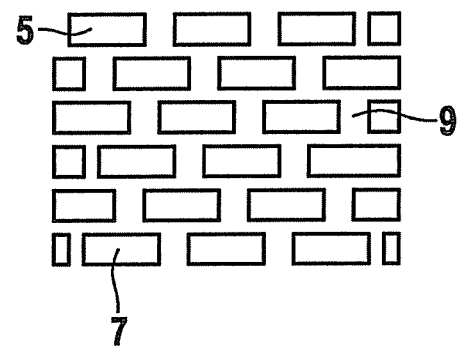
Figure 5:
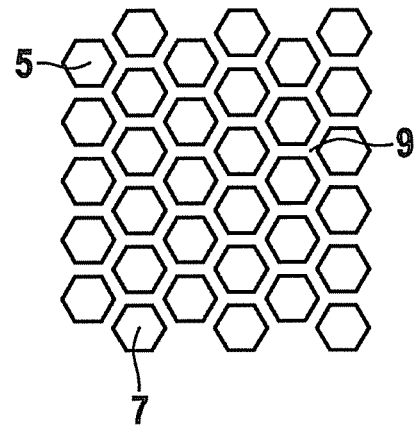

FIGS. 3 to 5 show, not conclusively, different possibilities for patterning one of the layers of the connecting layer system. Middle intermediate layer 5 is preferably patterned in this manner. It may be seen that patterning sections 7, in the exemplary embodiment according to FIG. 3, are contoured in a square manner and are arranged in regular rows and columns.

In the exemplary embodiment according to FIG. 4, patterned sections 7 are contoured rectangularly, that is, they have a greater extension in length than in width, and are arranged in the type of a brick wall pattern.

In the exemplary embodiment according to FIG. 5, patterned sections 7 are contoured and arranged hexagonally (honeycomb-shaped).

Figure 6:
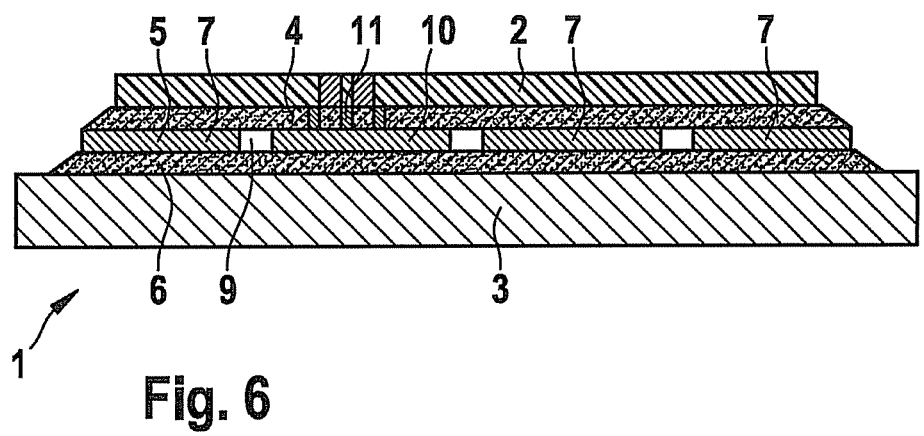
FIG. 6: an additional alternative exemplary embodiment of a composite component, in which a sensor is provided in the intermediate layer, which is plated-through the first joining layer, i.e. is connected in an electrically conductive manner to the first joining partner.

FIG. 6 shows an additional exemplary embodiment of a composite component 1, including a first and a second joining partner 2, 3, which are connected to each other via a layer system, including a first and a second joining layer 4, 6, as well as a sandwich-like intermediate layer 5 accommodated in between. As in the exemplary embodiment according to FIG. 2, intermediate layer 5 is patterned such that a fluid channel network 9 is arranged between laterally distanced patterning sections 7, through which cooling fluid is able to be guided. The exemplary embodiment according to FIG. 6 stands out in that a sensor, arranged as a temperature sensor, is integrated into intermediate layer 5, and is connected to first joining partner 2 in an electrically conductive manner by through-hole plating 11. The temperature of first joining partner 2 is able to be measured, especially monitored, using sensor 10.

If necessary, second joining partner 3, that is arranged as a heat sink, is able to be macro-patterned (not shown), in order to be able to dissipate the temperature in an improved manner. For this purpose, second joining partner 3 preferably includes cooling fins.

What is claimed is:

1. A composite component, comprising:
   a first joining partner;
   at least one second joining partner;
   a first joining layer arranged between the first joining partner and the second joining partner;
   at least one second joining layer arranged between the first joining partner and the second joining partner; and
   at least one intermediate layer arranged between the first joining layer and the second joining layer,
   wherein at least one of a sensor, and an actuator is provided in at least one of (a) the first joining layer, (b) the second joining layer, and (c) the intermediate layer and is electrically conductively connected via through-hole plating to at least one of the first joining partner and the at least one second joining partner.

2. The composite component according to claim 1, wherein a thermal coefficient of expansion of the intermediate layer is at least approximately equal to a thermal coefficient of expansion of at least one of (a) the first joining partner and (b) the second joining partner.

3. The composite component according to claim 1, wherein the first joining layer connects the first joining partner directly to the intermediate layer, and the second joining layer connects the second joining partner directly to the intermediate layer.

4. The composite component according to claim 1, wherein at least one of (a) the first joining layer, (b) the second joining layer, and (c) the intermediate layer is patterned laterally.

5. The composite component according to claim 4, wherein at least one of (a) a fluid channel and (b) a fluid channel network is arranged laterally between patterned sections of at least one of (a) the first joining layer, (b) the second joining layer, and (c) the intermediate layer to guide through a cooling fluid.

6. The composite component according to claim 5, further comprising a device adapted to apply at least one of (a) a fluid, (b) a cooling gas, and (c) a cooling fluid to the at least one of (a) the fluid channel and (b) the fluid channel network.

7. The composite component according to claim 1, wherein at least one of (a) the first joining layer and (b) the second joining layer includes at least one of (a) a sinter layer, (b) an adhesive layer, (c) a soldering metal layer, and (d) an elastomer sealing material.

8. The composite component according to claim 1, wherein at least one of (a) the first joining layer, (b) the second joining layer, and (c) the intermediate layer is at least one of (a) micro-patterned and (b) nano-patterned.

9. The composite component according to claim 1, wherein the sensor is plated through at least one of (a) the first joining layer and (b) the second joining layer.

10. The composite component according to claim 1, wherein the first joining partner includes at least one of (a) an electronic component, (b) a semiconductor element, (c) a power semiconductor element, (d) a circuit substrate, and (e) a circuit substrate that is fitted with components.

11. The composite component according to claim 1, wherein the second joining partner includes at least one of (a) a circuit substrate, (b) a heat sink, (c) a base plate, (d) a cooling body, (e) a housing, (f) an additional module, and (g) a logic module.

12. A method for producing a composite component, comprising:
   joining a first joining partner together with at least one second joining partner via at least one first joining layer;
   wherein for the joining of the joining partners, in addition at least one second joining layer and an intermediate layer to be situated between the joining layers are provided,
   wherein at least one of a sensor, and an actuator is provided in at least one of (a) the first joining layer, (b) the second joining layer, and (c) the intermediate layer and is electrically conductively connected via through-hole plating to at least one of the first joining partner and the at least one second joining partner.

13. The method according to claim 12, wherein the composite component is the composite component as recited in claim 1.

14. The composite component according to claim 1, wherein the composite component is produced according to the method recited in claim 12.

\* \* \* \* \*